United States Patent
Biber et al.

(10) Patent No.: US 9,547,054 B2
(45) Date of Patent: Jan. 17, 2017

(54) RECEIVING COIL AND LOCAL COIL FOR MAGNETIC RESONANCE APPLICATIONS WITH ADJUSTABLE LUGS

(75) Inventors: Stephan Biber, Erlangen/Frauenaurach (DE); Daniel Driemel, Oederan (DE); Stephan Zink, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 1298 days.

(21) Appl. No.: 13/441,900

(22) Filed: Apr. 8, 2012

(65) Prior Publication Data

US 2012/0256633 A1 Oct. 11, 2012

(30) Foreign Application Priority Data

Apr. 8, 2011 (DE) .................. 10 2011 007 065

(51) Int. Cl.
*G01R 33/3415* (2006.01)
*G01R 33/34* (2006.01)

(52) U.S. Cl.
CPC ..... *G01R 33/34084* (2013.01); *G01R 33/3415* (2013.01)

(58) Field of Classification Search
USPC .......................... 324/300–322; 600/407–435
See application file for complete search history.

(56) References Cited

U.S. PATENT DOCUMENTS

| | | | |
|---|---|---|---|
| 4,887,038 A | 12/1989 | Votruba et al. ............... | 324/318 |
| 6,011,393 A * | 1/2000 | Kaufman ......... | G01R 33/34046 |
| | | | 324/318 |
| 6,137,291 A * | 10/2000 | Szumowski et al. ......... | 324/318 |
| 6,750,653 B1* | 6/2004 | Zou et al. ..................... | 324/318 |
| 7,619,416 B2 | 11/2009 | Nordmeyer-Massner et al. ............................. | 324/318 |
| 7,646,199 B2* | 1/2010 | Dannels ........... | G01R 33/34007 |
| | | | 324/307 |
| 9,134,389 B2* | 9/2015 | Driemel ........... | G01R 33/34007 |
| 2005/0174117 A1 | 8/2005 | Greim et al. ................. | 324/318 |
| 2008/0204021 A1 | 8/2008 | Leussler et al. .............. | 324/318 |

(Continued)

FOREIGN PATENT DOCUMENTS

DE    10 2004 005 120 A1    8/2005

OTHER PUBLICATIONS

German Office Action dated Oct. 28, 2011 for corresponding German Patent Application No. DE 10 2011 007 065.6 with English translation.

*Primary Examiner* — Melissa Koval
*Assistant Examiner* — Tiffany Fetzner
(74) *Attorney, Agent, or Firm* — Lempia Summerfield Katz LLC

(57) ABSTRACT

A local coil for magnetic resonance applications includes a rigid housing that radially surrounds a substantially cylindrical examination volume. Arranged in the rigid housing is a transmitting coil, by which an excitation signal may be applied to the examination volume. An object to be examined arranged in the examination volume may be excited by the excitation signal for emitting a magnetic resonance signal. The local coil includes a size-variable structure, in which an antenna assembly for receiving the magnetic resonance signal emitted by the object to be examined is arranged. The size-variable structure is arranged in the examination volume and is connected to the rigid housing. The size-variable structure is soft and flexible.

4 Claims, 5 Drawing Sheets

(56) References Cited

U.S. PATENT DOCUMENTS

2008/0211498 A1* 9/2008 Dannels ........... G01R 33/34007
　　　　　　　　　　　　　　　　　　　　　324/309
2012/0153956 A1* 6/2012 Driemel ........... G01R 33/34007
　　　　　　　　　　　　　　　　　　　　　324/322
2012/0256633 A1* 10/2012 Biber et al. ................... 324/322

* cited by examiner

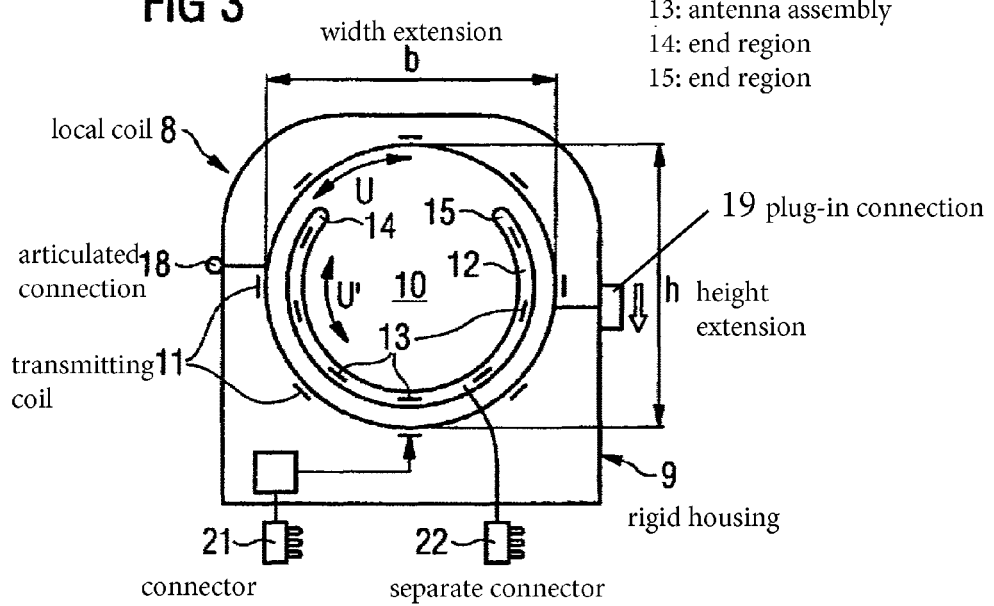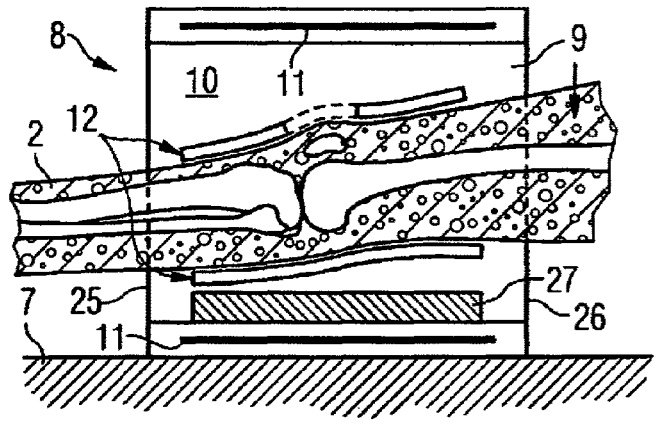

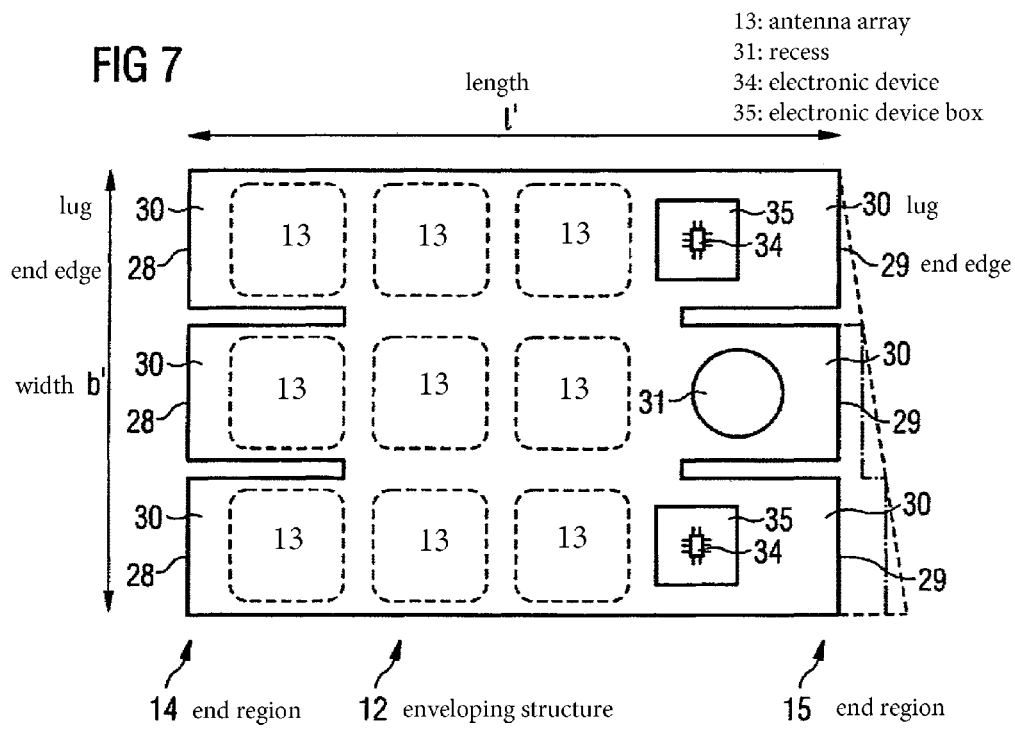
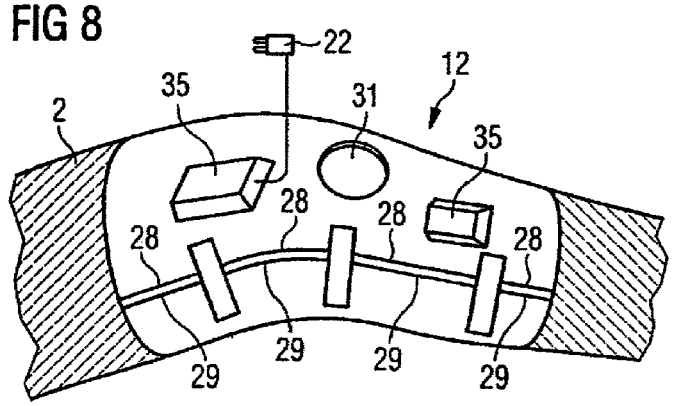

13: antenna array
32: recesses
33: recess
34: electronic device
35: electronic device box

RECEIVING COIL AND LOCAL COIL FOR MAGNETIC RESONANCE APPLICATIONS WITH ADJUSTABLE LUGS

This application claims the benefit of DE 10 2011 007 065.6, filed on Apr. 8, 2011.

BACKGROUND

The present embodiments relate to a receiving coil for magnetic resonance applications.

Images with a high signal-to-noise ratio (SNR) may be recorded in magnetic resonance imaging using local coils. Local coils are antenna systems that are provided in the immediate vicinity on top of (anterior) or underneath (posterior) the patient. During a magnetic resonance measurement, the excited atomic nuclei induce a voltage in the individual antennae of the local coil. The induced voltage is amplified by a low noise preamplifier (e.g., low noise amplifier (LNA)) and forwarded (e.g., via a cable) to the receiving electronic device. "Local coil" and "receiving coil" therefore denote an antenna system that may include one or more antenna elements (coil elements). The individual antenna elements may be configured as loop antennae, butterfly coils or saddle coils. A coil includes the antenna elements, the preamplifiers, further electronic devices and cabling, the housing and may include a cable with a connector, by way of which the coil is connected to the magnetic resonance system. The receiver arranged on the system side filters and digitizes the signal received by the local coil and passes the data to an evaluation device that may derive an image or a spectrum from the measurement. The evaluation device makes the derived image or spectrum available to the user for diagnosis.

Specific coils may be used for imaging in the region of the extremities (e.g., arms, legs, hands, feet) in the prior art. It is necessary, for example, for the requirements of orthopedic imaging, for the coils to be configured as transmitting and receiving coils. The local coil, which covers only parts of the body and not the whole body coil, surrounds the whole body and is used for transmitting. The same coil is also used for receiving.

SUMMARY AND DESCRIPTION

The present embodiments may obviate one or more of the drawbacks or limitations in the related art. For example, a receiving coil for magnetic resonance systems suitable for application to limbs of the human body is provided.

According to the present embodiments, in a receiving coil for magnetic resonance applications, viewed in the width direction, at least one of the end regions is divided into lugs. The lugs, in the flat state, may be individually connected to one, viewed in the longitudinal direction, opposing section respectively of the other end region, so a respective ring circumference of the enveloping structure may be individually adjusted for each lug. The receiving coil may be adapted to the dimensions of the body part surrounded by the receiving coil even if the circumference of the relevant body part changes in the region of the receiving coil. By way of example, the thigh, knee and lower leg of a patient may have different circumferences from each other.

The receiving coil may be configured as a knee or elbow coil. In this case, the enveloping structure may have a recess for the kneecap or elbow. Alternatively, the receiving coil may be configured as an ankle and/or heel coil. The enveloping structure may have two recesses for the ankles and/or a recess for the heel. The receiving coil has an electronic device interacting with the antenna assembly. The electronic device may be arranged in (at least) one electronic device box. The electronic device box may be arranged in a region of the enveloping structure that, when the receiving coil is used as intended, faces radially outwards and upwards.

A local coil for magnetic resonance applications that combines good field homogeneity during excitation with a high signal-to-noise ratio when receiving is also provided.

According to the present embodiments, a local coil for magnetic resonance applications includes a size-variable structure, in which an antenna assembly for receiving the magnetic resonance signal emitted by the object to be examined is arranged. The size-variable structure is arranged in the examination volume and is connected to the housing.

Good field homogeneity is provided by arranging the transmitting coil in the rigid housing. The spacing of the antenna assembly from the body part to be examined may be minimized, and the signal-to-noise ratio may be optimized thereby by arranging the antenna assembly used for receiving in the size-variable structure.

In one embodiment, the housing has an internal circumference, and the size-variable structure has a maximum external circumference. The maximum external circumference is smaller than the internal circumference (e.g., at least 15 cm smaller than the internal circumference). This exemplary dimensioning has proven to be advantageous in tests.

The housing may include a plurality of housing parts, so the housing may be opened. Easy introduction into the housing of the body part to be examined is possible as a result of this embodiment.

In one embodiment of a multi-part housing, when the local coil is used as intended, one of the housing parts is arranged on a patient couch. When the one housing part is arranged on the patient couch, at least another of the housing parts may be moved relative to the one housing part to open and close the housing. This results in easier handling of the local coil, for example.

The size-variable structure may be connected to any of the housing parts. The size-variable structure may be connected to the housing part that, when the local coil is used as intended, is arranged on the patient couch.

A connector for connecting the transmitting coil to an activation device is arranged on one of the housing parts. The size-variable structure may be connected to this housing part. In addition to contacts for activating the transmitting coil, the connector may, for example, include contacts for transferring the magnetic resonance signal received by the antenna assembly to an evaluation device.

The local coil may, if required, be configured as a knee, elbow, wrist, ankle, heel or head coil.

In one embodiment, the size-variable structure may be connected to the housing only at certain points, so a filling structure may be introduced between the size-variable structure and the housing.

The size-variable structure may have a certain inherent stability. In one embodiment, the size-variable structure is configured as a flexible, soft structure. For example, the size-variable structure may be configured as a receiving coil, as is described above.

BRIEF DESCRIPTION OF THE DRAWINGS

FIG. 3 schematically shows a cross-sectional view of one embodiment of the local coil from FIG. 2;

FIG. 4 schematically shows a cross-sectional side view of one embodiment of the local coil from FIG. 2;

FIG. 7 shows a plan view of one embodiment of a receiving coil in a laid-out state;

FIG. 8 shows a perspective view of one embodiment of the receiving coil of FIG. 3 in a state bent to form a ring.

DETAILED DESCRIPTION OF THE DRAWINGS

Figure 1:
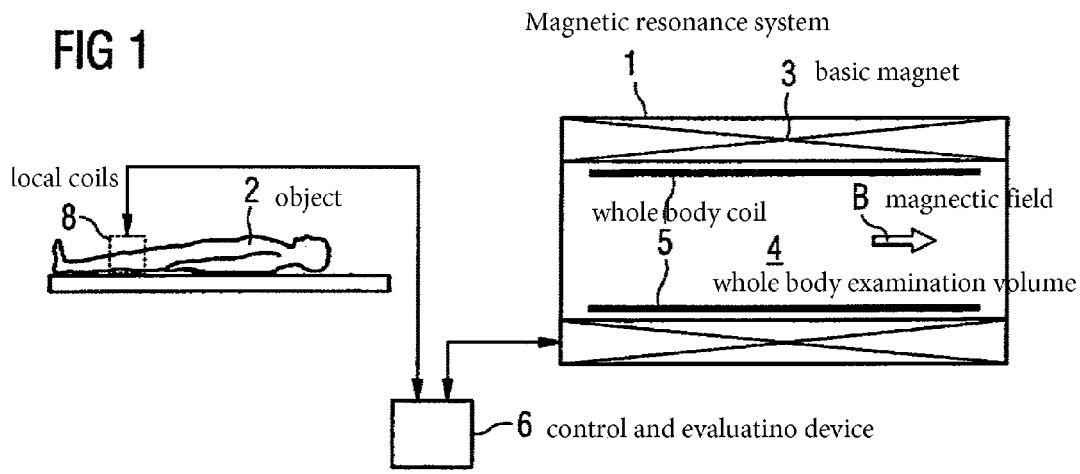
FIG. 1 schematically shows one embodiment of a magnetic resonance system.

According to FIG. 1, an object 2 is to be examined by a magnetic resonance system 1. The magnetic resonance system 1 has a basic magnetic 3 that generates a temporally static and locally substantially homogeneous basic magnetic field B in a whole body examination volume 4. The strength of the basic magnetic field B may be determined as required (e.g., 1.5 Tesla or 3 Tesla). Other values are also possible (e.g., up to more than 10 Tesla).

The magnetic resonance system 1 also includes a whole body coil 5. High-frequency excitation pulses may be applied to the whole body examination volume 4 by the whole body coil 5. The whole body coil 5 is stationarily arranged relative to the basic magnet 3. The whole body coil 5 is controlled by a control and evaluation device 6 of the magnetic resonance system 1.

The object 2 to be examined (e.g., a person) lies on a patient couch 7 during the examination. To examine the object 2, the patient couch 7 is moved into the whole body examination volume 4.

The whole body coil 5 may be used to excite magnetic resonances and to subsequently receive magnetic resonance signals excited in the object 2 to be examined. One or more local coils 8 may be present for receiving the magnetic resonance signal. A local coil 8 of this kind is shown with broken lines in FIG. 1.

Within the scope of the present embodiments, the local coil 8 may be used for exciting the object 2 to be examined to emit the magnetic resonance signal and to receive the excited magnetic resonance signal. The local coil 8 is connected to the control and evaluation device 6.

Local coils 8 may, depending on the embodiment, be arranged on the object 2 to be examined or on the patient couch 7. FIG. 1 shows an arrangement of the local coil 8 on the patient couch 7. FIG. 1 also shows an embodiment of the local coil 8 as a knee coil. The local coil 8 may alternatively be configured as an elbow coil, a wrist coil, an ankle coil, a heel coil, or a head coil.

According to FIGS. 2 to 6, the local coil 8 includes a rigid housing 9. The rigid housing 9 surrounds a local examination volume 10 radially outwardly. A transmitting coil 11 is arranged in the rigid housing 9. The transmitting coil 11 may be configured, by way of example, as a saddle coil or as a birdcage resonator. An excitation signal may be applied to the local examination volume 10 using the transmitting coil 11. The object 2 to be examined (if the object 2 to be examined is located in the local examination volume 10) may be excited by the excitation signal to emit a magnetic resonance signal. In relation to the local examination volume 10, the transmitting coil 11 therefore has the same object, effect and function as the whole body coil 5 in relation to the whole body examination volume 4.

The local coil 8 also includes a size-variable structure 12. The size-variable structure 12 is arranged in the local examination volume 10 (e.g., in a volume surrounded by the rigid housing 9). The size-variable structure 12 is connected to the housing 9 (e.g., forms a unit therewith).

An antenna assembly 13 is arranged in the size-variable structure 12. The antenna assembly 13 is used for receiving the magnetic resonance signal emitted by the object 2 to be examined. The antenna assembly 13 may be configured as required. The antenna assembly 13 may be configured as a birdcage resonator, for example. In one embodiment, the antenna assembly 13 may be configured as a one- or two-dimensional antenna array. The local examination volume 10 has a height extension h and a width extension b and therefore an internal circumference U. The height extension h and the width extension b may be the same size. The local examination volume 10 has a cylindrical cross-section. Alternatively the cross-section of the local examination volume 10 may differ from the exact circular shape and may, for example, be elliptical or oval. In one embodiment, the relationship $0.8 \leq h/b \leq 1.25$ is valid for the ratio of height extension h and width extension b.

The size variability of the size-variable structure 12 may be achieved in any number of ways. For example, the size-variable structure 12 may have at end regions 14, 15, components of Velcro tape that interact with each other. Irrespective of how the size variability of the size-variable structure 12 is achieved, the size-variable structure 12 has a maximum circumference U'. The maximum circumference U' of the size-variable structure 12 may be smaller than the circumference U of the local examination volume 10 (or of the internal circumference of the housing 9). The maximum circumference U' may, for example, be at least 15 cm smaller than the internal circumference U of the housing 9. In one embodiment, the maximum circumference U' is up to 60 cm smaller than the internal circumference U. The difference may be between 30 cm and 45 cm.

Figure 2:
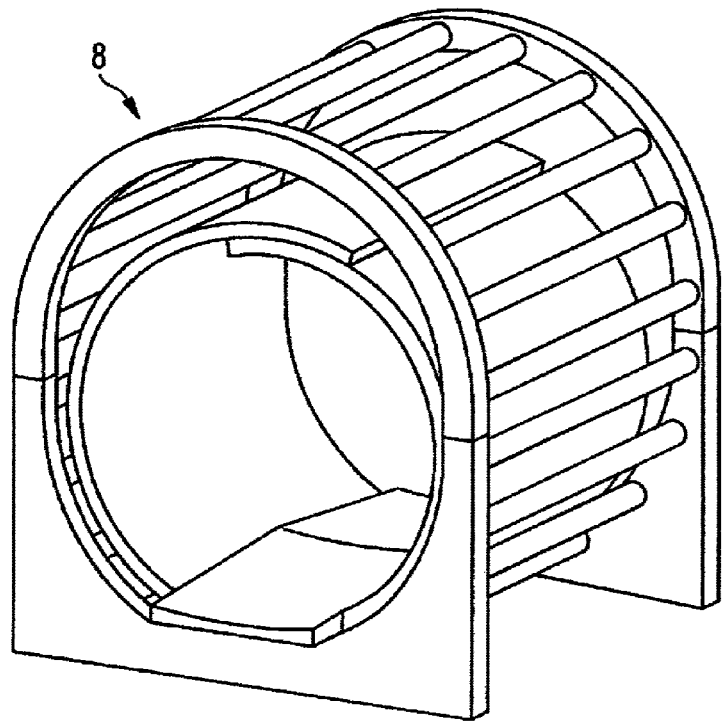
FIG. 2 schematically shows one embodiment of a local coil.
Figure 5:
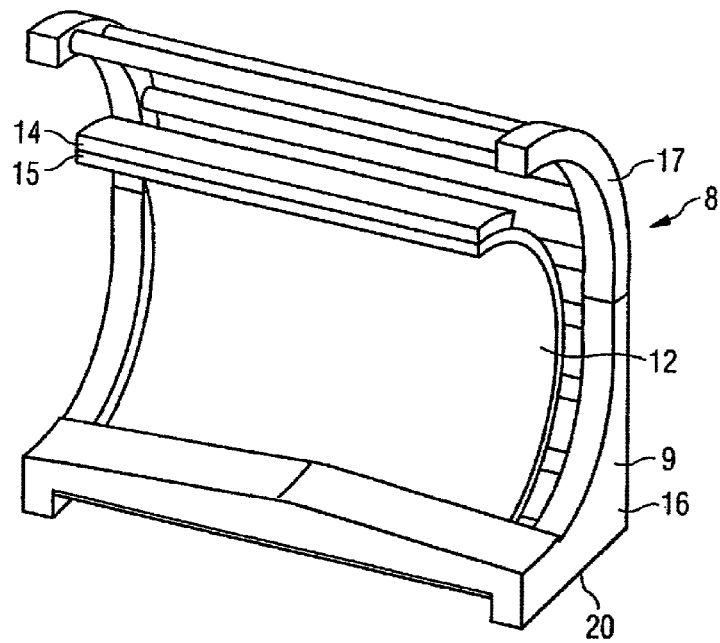
FIG. 5 schematically shows a perspective view of one embodiment of the local coil from FIG. 4.

As shown in the different views in FIG. 2, the housing 9 may include a plurality of housing parts 16, 17, so the housing may be opened. For example, the housing 9 may have a bottom part 16 and a top part 17. A mechanically and electrically articulated connection 18 may also be arranged on one side of the housing 9 (see FIG. 3), and a plug-in connection 19 may be arranged on the other side of the housing 9, so the top part 17 may be opened and shut like the lid of a chest (see the one [1] arrow on the right-hand side of the housing 9 in FIG. 3). Alternatively (see FIG. 6), a plug-in connection 19 may be arranged on both sides, so the top part 17 may be completely removed from the bottom part 16 (see the two arrows on both sides of the housing 9).

In one embodiment, the housing 9 must be opened and closed in advance. For example, when the housing 9 is divided into the bottom part 16 and the top part 17 and when the local coil 8 is used as intended, one of the bottom part 16 and the top part 17 (e.g., the bottom part 16) may be arranged on the patient couch 7, and the other of the bottom parts 16 and the top part 17 (e.g., the top part 17) may be movable relative to the one housing part 16 even if the one housing part 16 is arranged on the patient couch 7.

Because the size-variable structure 12 is connected to the housing 9, the size-variable structure 12 is connected to one of the housing parts 16, 17 in the case of a multi-part housing 9. For example, the size-variable structure 12 may be connected to any of the housing parts 16, 17. The size-variable structure 12 may be connected to the housing part 16 that, when the local coil 8 is used as intended, is arranged on the patient couch 7. Use as intended may be evident, for example, by the fact that the bottom part 16 has a supporting surface 20 for positioning on the patient couch 7. Alternatively or additionally, use as intended may be defined, for example, in that the bottom part 16 and the patient couch 7 include the two parts of an interacting plug-in connection that is automatically produced when the bottom part 16 is placed in the "correct" position on the patient couch 7.

The local coil 8 is connected to the control and evaluation device 6. For example, the excitation signals, which the emitting coil 11 is to emit, are transmitted to the transmitting coil 11. A connector 21 is therefore arranged on the housing 9 or in the case of the multi-part housing 9, on one of the housing parts 16, 17. The transmitting coil 11 is connected to the control and evaluation device 6 via the connector 21. In one embodiment of the local coil 8, the size-variable structure 12 is connected to the housing part 16, on which this connector 21 is arranged. If the connector 21, as shown in FIG. 3, is arranged on the bottom part 16, the two arrangements of the size-variable structure 12 may be identical to each other.

The signals transmitted to the transmitting coil 11 are power signals. The power signals are therefore transmitted via cable. The magnetic resonance signals received by the antenna assembly 13 may be weak signals. The received magnetic resonance signals may be transmitted wirelessly to the control and evaluation device 6. Due to the fact that there is already a cable connection owing to the transmitting coil 11, the received magnetic resonance signals may be transmitted to the control and evaluation device 6 using wires. In one embodiment, a separate connector 22 may be provided in accordance with the diagram in FIG. 3, for this purpose. The connector 21, which connects the transmitting coil 11 to the control and evaluation device 6, includes contacts 23 for activating the transmitting coil 11, according to FIG. 6, and contacts 24 for transmitting the magnetic resonance signal received by the antenna assembly 13 to the control and evaluation device 6.

The size-variable structure 12 (including the antenna assembly 13) may be permanently connected to the housing 9. Alternatively, loose connection may exist. By way of example, a loop may be arranged on a side of the housing 9 facing the local examination volume 10. The size-variable structure 12 is pulled through the loop. The loop may be connected to the housing 9, for example, at leading and trailing ends of the housing 9 non-detachably or detachably by way of Velcro tape, a snap lock, a push button, etc. Different connectors 21, 22 may be provided for connecting the transmitting coil 11 and the antenna assembly 13 to the control and evaluation device 6 in the case of a detachable connection of the size-variable structure 12 to the housing 9.

Alternatively the size-variable structure 12 may be permanently connected to the housing 9, although the connection may be made only at certain points (e.g., point-wise at the leading and trailing ends 25, 26 of the housing 9). A filling structure 27, for example, may be introduced between the size-variable structure 12 and the housing 9 (see FIG. 4). The filling structure 27 may be configured as required (e.g., so as to be trough-, wedge- or roof-shaped).

Figure 6:
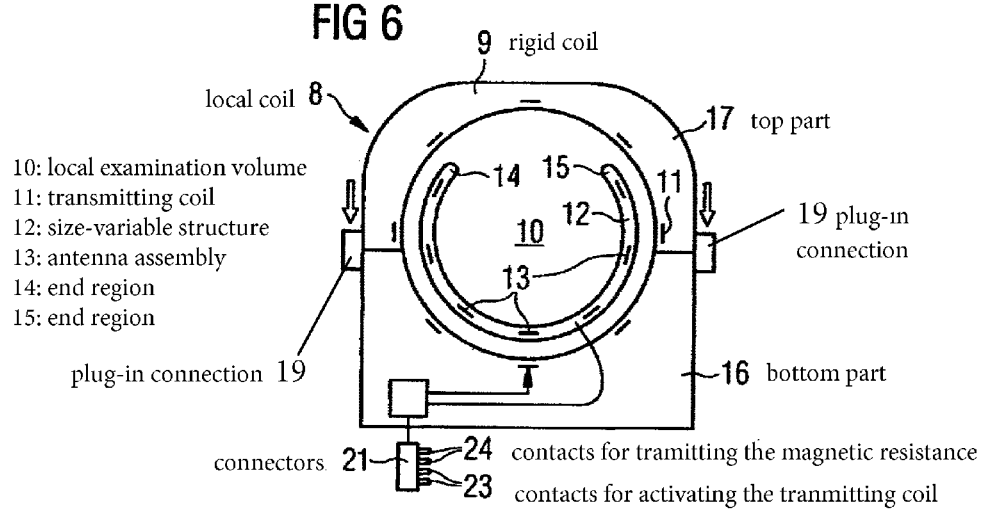
FIG. 6 schematically shows an embodiment of the local coil modified with respect to FIG. 3.

The size-variable structure 12, according to FIGS. 3 and 6, may be configured as an inherently stable structure, so a certain application of force is used to change the size of the size-variable structure 12. Alternatively, the size-variable structure 12 may be configured as a soft and flexible ("limp") structure. For example, the size-variable structure 12 may be configured as a receiving coil as is described in more detail below in conjunction with FIGS. 7 to 9.

The receiving coil has a soft, flexible enveloping structure 12 (in accordance with the size-variable structure 12 in FIGS. 1 to 6). The antenna assembly 13 is arranged in the enveloping structure 12. The enveloping structure 12, similar to a cuff as is used for measuring blood pressure, is configured so the enveloping structure 12 may be flat. FIG. 7 shows this state. In this state, the enveloping structure 12 extends over a length l' in a longitudinal direction and over a width b' in a width direction. The length direction and width direction run orthogonally to each other.

The length l' may be constant or substantially constant over the width b'. The width b' may be constant or substantially constant viewed over the length l'. The enveloping structure 12 is therefore substantially rectangular. Alternatively, the enveloping structure 12 may taper in the manner of a trapezoid (indicated by broken lines in FIG. 7) or taper in stages (indicated by dot-dash lines in FIG. 7).

The enveloping structure 12 may be bent from the flat state to form a ring. Viewed in the width direction, the ring extends over the width b'. In this state (e.g., in the state bent into a ring), the end regions 14, 15 of the enveloping structure 12 are joined together by a connecting structure. The connecting structure may be formed, for example, as Velcro tape. In the flat state of the enveloping structure 12, the end regions 14, 15 oppose each other with respect to the enveloping structure 12. The end edges 28, 29 are therefore spaced apart from each other by the respective (optionally over the width b', location-dependent) length l'.

Viewed in the width direction, at least one of the end regions 14, 15 (according to FIG. 7, both end regions 14, 15) is/are divided into lugs 30. The lugs 30 may be individually connected (e.g., independently of the other lugs 30 of the respective end region 14, 15) to the, viewed in the longitudinal direction, opposing section/lug 30 respectively of the other end region 15, 14. A respective ring circumference of the enveloping structure 12 may be individually adjusted for each lug 30 as a result. This is shown in FIG. 8. One of the lugs 30 is arranged respectively in the region of the thigh, knee and lower leg of the object 2 to be examined.

The receiving coil in FIGS. 7 and 8 is configured as a knee coil. The enveloping structure 12 therefore may include a recess 31 for the kneecap of the object 2 to be examined. The enveloping structure 12 may analogously also include a corresponding recess if the receiving coil is configured as an elbow coil.

Figure 9:
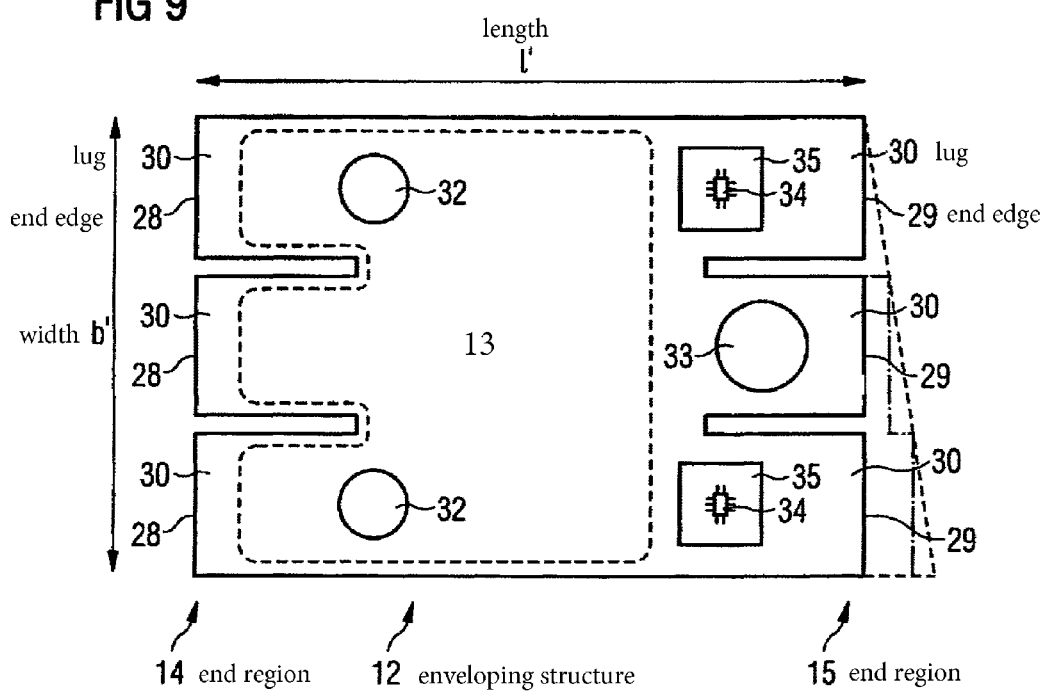
FIG. 9 shows a plan view of a possible modification of one embodiment of the receiving coil of FIG. 7.

According to FIG. 9, the receiving coil is configured as an ankle and/or heel coil. The enveloping structure 12 may include two recesses 32 for the ankles of the object 2 to be examined. Alternatively or additionally, the receiving coil may include a recess 33 for the heel of the object 2 to be examined.

The antenna assembly 13 may be configured as required with respect to the electrical embodiment. In one embodiment, the antenna assembly is configured as an antenna array in accordance with the diagram in FIG. 7 (e.g., a two-dimensional antenna array 13 (shown only schematically as a unit in FIG. 9)).

According to FIGS. 7 to 9, the receiving coil includes an electronic device 34 that interacts with the antenna assembly 13. The electronic device 34 may include preamplifiers, analog to digital converters, a frequency converter, detuning circuits, etc. The electronic device 34 may be arranged in (at least) one electronic device box 35. According to FIGS. 7 to 9, two such electronic device boxes 35 are provided. The electronic device boxes 35 may have any number of dimensions. Dimensions of about 5 cm×5 cm×2 cm, for example, may be provided. According to FIG. 8, the electronic device boxes 35 are arranged in a region of the enveloping structure 12 that, when the enveloping structure 12 is used as intended, faces radially outwards and upwards. This optimizes user comfort for the object 2 to be examined when the receiving coil is applied. The corresponding arrangement may have further advantages.

The present embodiments have many advantages. For example, a high quality excitation to magnetic resonances with high quality receiving of excited magnetic resonances may be achieved. Good positioning of the receiving coil coupled with a high level of user comfort also result.

The above description is used solely to elucidate the present embodiments. The scope of the present invention should be determined solely by the accompanying claims, however.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A receiving coil configured for magnetic resonance applications, the receiving coil comprising:
    a soft, flexible enveloping structure, in which an antenna assembly that receives a magnetic resonance signal is arranged, the enveloping structure being configurable into a flat state, and extending over a length in a longitudinal direction and over a width in a width direction, the enveloping structure being bendable from the flat state into a ring that extends over the width in the direction of a ring axis,
    wherein in the flat state, end regions of the enveloping structure that oppose each other with respect to the enveloping structure are joined together by a connecting structure in a state of the enveloping structure that is bent in order to form a ring, and
    wherein, when viewed in the width direction, at least one of the end regions is divided into lugs that, in the flat state, are individually connectable to one opposing section of the other end region when viewed in the longitudinal direction, and whereby a respective ring circumference of the enveloping structure is individually adjustable for each of the lugs.

2. The receiving coil as claimed in claim 1,
    wherein the receiving coil is configured as either a knee coil or an elbow coil, and the enveloping structure has a recess for either a kneecap or an elbow of a patient, or
    wherein the receiving coil is configured as an ankle coil, a heel coil, or a combination thereof, and the enveloping structure has two recesses configured for the ankles of the patient, a recess configured for a heel of the patient, or an ankle and heel recess combination.

3. The receiving coil as claimed in claim 1, wherein the receiving coil comprises an electronic device interacting with the antenna assembly, the electronic device being arranged in at least one electronic device box, the at least one electronic device box being arranged in a region of the enveloping structure that, when the receiving coil is used as intended, the enveloping structure faces radially outwards and upwards.

4. A local coil configured for magnetic resonance applications, the local coil comprising:
    a rigid housing that radially surrounds a substantially cylindrical examination volume; a transmitting coil, by which an excitation signal is applicable to the examination volume, arranged within the rigid housing, an object to be examined that is arranged in the examination volume being excitable by the excitation signal in order to emit a magnetic resonance signal; and
    a size-variable structure, in which an antenna assembly configured for receiving the magnetic resonance signal emitted by the object to be examined is arranged, wherein the size-variable structure is arranged in the examination volume and is surrounded by and connected to the rigid housing,
    wherein the size-variable structure is connected to the rigid housing only at certain points, such that a filling structure is introducible between the size-variable structure and the rigid housing,
    wherein the size-variable structure is configured as a receiving coil, the receiving coil comprising:
        a soft, flexible enveloping structure, in which the antenna assembly receiving the magnetic resonance signal is arranged, the enveloping structure being configurable into a flat state, and extending over a length in a longitudinal direction as well as over a width in a width direction, the enveloping structure also being bendable from the flat state into a ring that extends over the width in the direction of a ring axis,
        wherein in the flat state, end regions of the enveloping structure that oppose each other with respect to the enveloping structure are joined together by a connecting structure having a state of the enveloping structure that is bent in order to form a ring, and
        wherein, when viewed in the width direction, at least one of the end regions is divided into lugs that, in the flat state, are individually connectable to one, when viewed in the longitudinal direction, opposing section of the other end region when viewed in the longitudinal direction, and whereby a respective ring circumference of the enveloping structure is individually adjustable for each of the lugs.

* * * * *